(12) United States Patent
Takamaru et al.

(10) Patent No.: US 9,373,648 B2
(45) Date of Patent: Jun. 21, 2016

(54) SEMICONDUCTOR DEVICE AND METHOD OF MANUFACTURE THEREOF

(71) Applicant: Sharp Kabushiki Kaisha, Osaka-shi, Osaka (JP)

(72) Inventors: Yutaka Takamaru, Osaka (JP); Kazuatsu Ito, Osaka (JP); Tadayoshi Miyamoto, Osaka (JP); Mitsunobu Miyamoto, Osaka (JP); Makoto Nakazawa, Osaka (JP); Yasuyuki Ogawa, Osaka (JP); Seiichi Uchida, Osaka (JP); Shigeyasu Mori, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/396,079

(22) PCT Filed: Apr. 22, 2013

(86) PCT No.: PCT/JP2013/061733
§ 371 (c)(1),
(2) Date: Oct. 22, 2014

(87) PCT Pub. No.: WO2013/161738
PCT Pub. Date: Oct. 31, 2013

(65) Prior Publication Data
US 2015/0084039 A1    Mar. 26, 2015

(30) Foreign Application Priority Data

Apr. 23, 2012 (JP) ................................. 2012-097443

(51) Int. Cl.
*H01L 29/66* (2006.01)
*H01L 29/786* (2006.01)
(Continued)

(52) U.S. Cl.
CPC .......... *H01L 27/124* (2013.01); *G02F 1/13452* (2013.01); *H01L 21/425* (2013.01);
(Continued)

(58) Field of Classification Search
CPC ... H01L 29/786; H01L 29/66; H01L 29/7869; H01L 29/78606; H01L 29/66969; H01L 29/417; H01L 29/41733; H01L 29/45; H01L 27/12; H01L 27/124; H01L 27/1288; H01L 27/1225; H01L 27/1227; H01L 29/12; H01L 27/3248; H01L 27/3258; H01L 2924/13069
USPC .................................... 257/43, 440, 432, 449
See application file for complete search history.

(56) References Cited

U.S. PATENT DOCUMENTS

| 2011/0050551 A1 | 3/2011 | Ota et al. |
| 2012/0108018 A1 | 5/2012 | Okabe et al. |

(Continued)

FOREIGN PATENT DOCUMENTS

| JP | 2011-053443 A | 3/2011 |
| JP | 2011-091279 A | 5/2011 |
| JP | 2012-018970 A | 1/2012 |
| WO | 2011/010415 A1 | 1/2011 |

(Continued)

OTHER PUBLICATIONS

Official Communication issued in International Patent Application No. PCT/JP2013/061733, mailed on Jun. 4, 2013.

*Primary Examiner* — Chuong A Luu
(74) *Attorney, Agent, or Firm* — Keating & Bennett, LLP

(57) ABSTRACT

This semiconductor device (100A) includes: an oxide layer (15) which includes a semiconductor region (5) and a conductor region (7) that contacts with the semiconductor region; a source electrode (6s) and a drain electrode (6d) which are electrically connected to the semiconductor region; an insulating layer (11) formed on the source and drain electrodes; a transparent electrode (9) arranged to overlap at least partially with the conductor region with the insulating layer interposed between them; a source line (6a) formed out of the same conductive film as the source electrode; and a gate extended line (3a) formed out of the same conductive film as a gate electrode (3). The source line is electrically connected to the gate extended line via a transparent connecting layer (9a) which is formed out of the same conductive film as the transparent electrode.

5 Claims, 10 Drawing Sheets

(51) Int. Cl.
*H01L 27/12* (2006.01)
*G02F 1/1345* (2006.01)
*H01L 21/425* (2006.01)
*G02F 1/1368* (2006.01)

(52) U.S. Cl.
CPC ........ *H01L27/1225* (2013.01); *H01L 27/1288* (2013.01); *H01L 29/66969* (2013.01); *H01L 29/7869* (2013.01); *H01L 29/78606* (2013.01); *G02F 1/1368* (2013.01)

(56) References Cited

U.S. PATENT DOCUMENTS

2014/0367677 A1* 12/2014 Miyamoto .......... H01L 29/7869
257/43
2015/0069381 A1* 3/2015 Miyamoto ........ H01L 29/66969
257/43

FOREIGN PATENT DOCUMENTS

WO     2013/115052 A1    8/2013

* cited by examiner

FIG.3
(a)
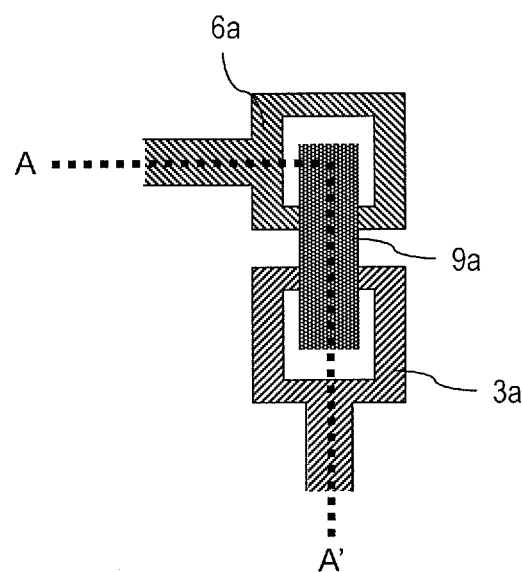
(b)
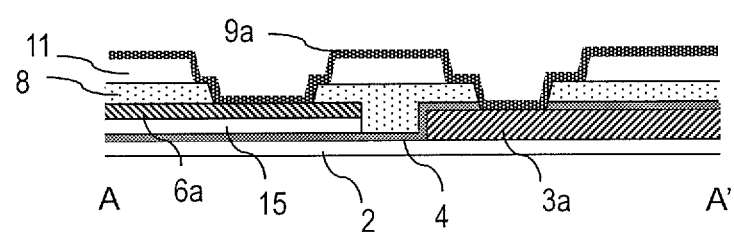
(c)
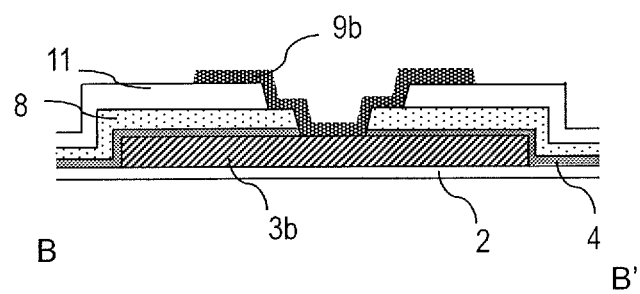

FIG.4
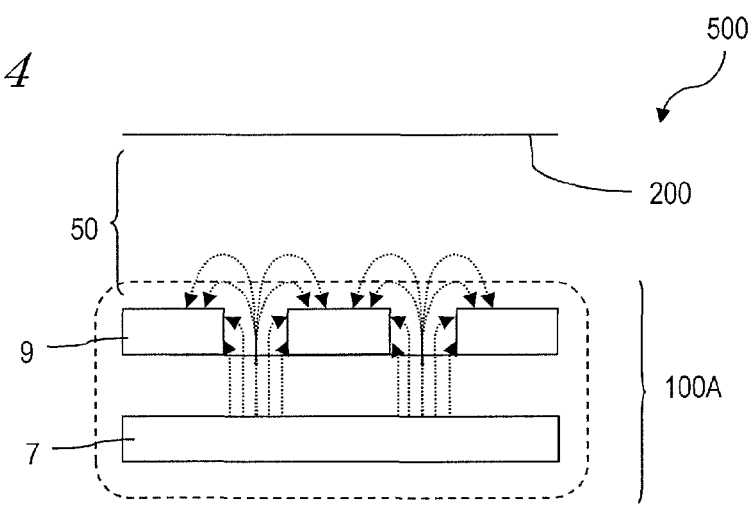
FIG.5
(a)
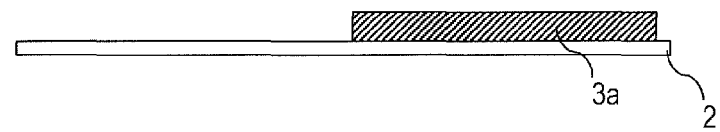
(b)
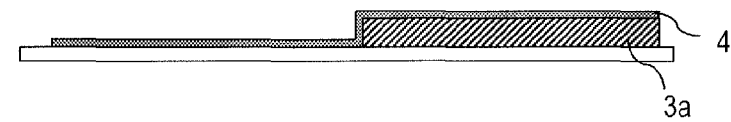
(c)
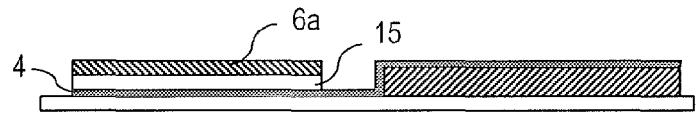
(d)
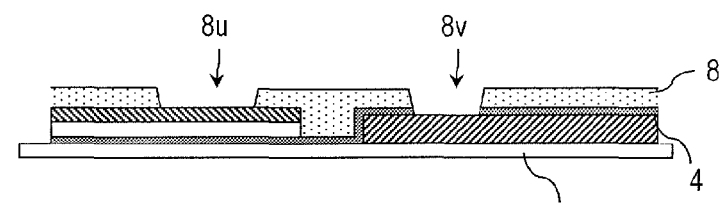
(e)
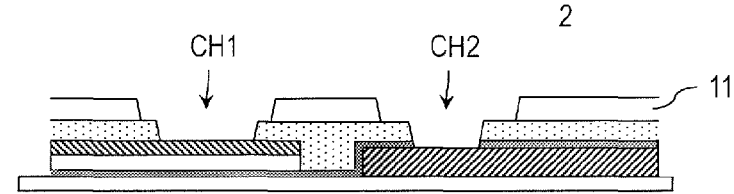

FIG.10
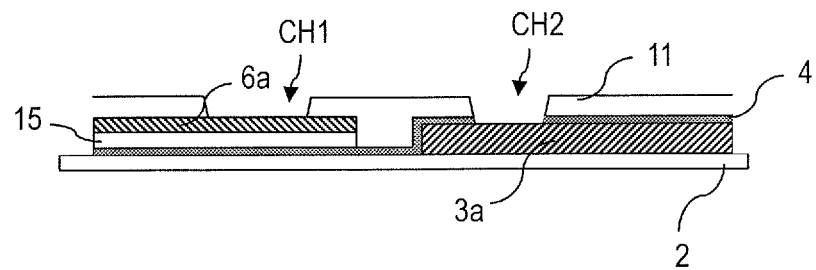
FIG.11
(a)
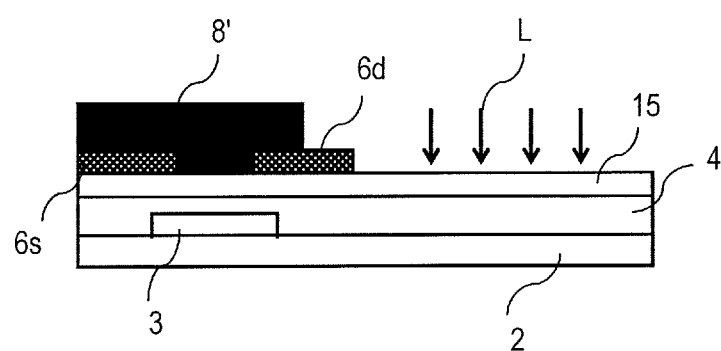
(b)
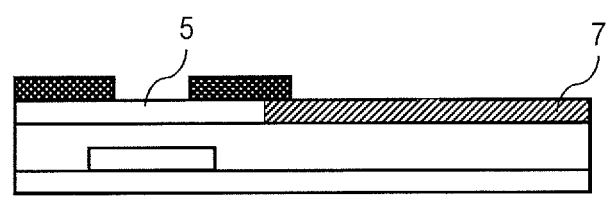
(c)
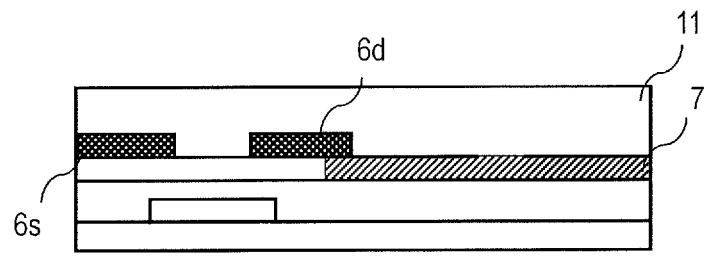

FIG.12
(a)
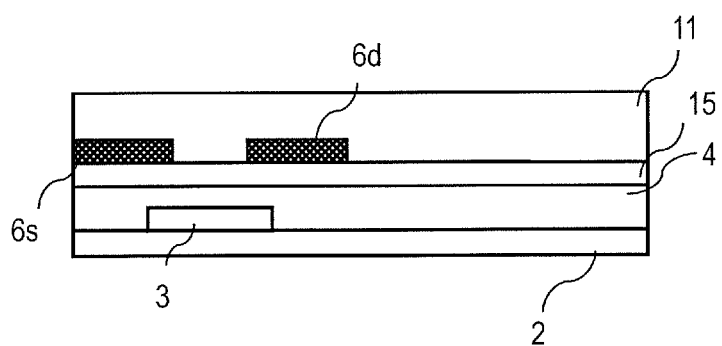
(b)
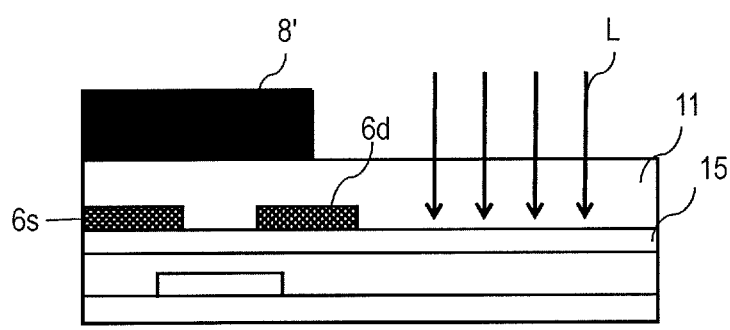
(c)
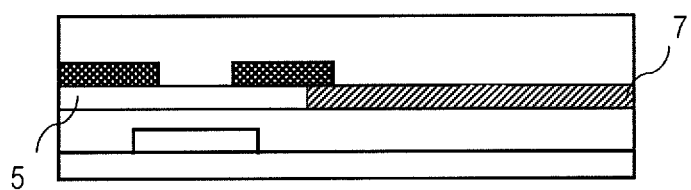

*FIG.13*
(a)
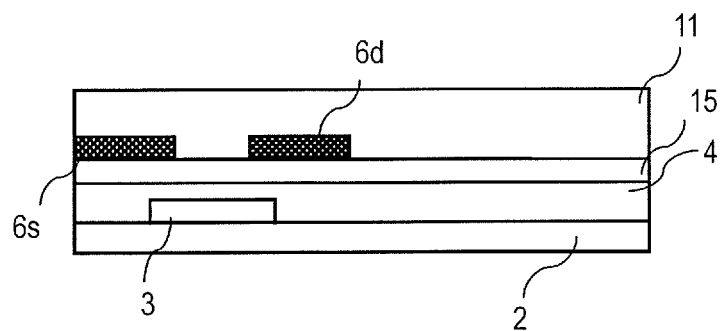
(b)
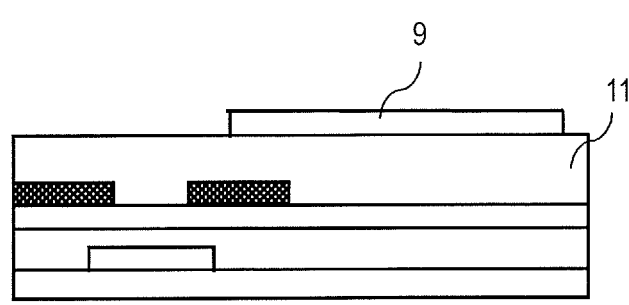
(c)
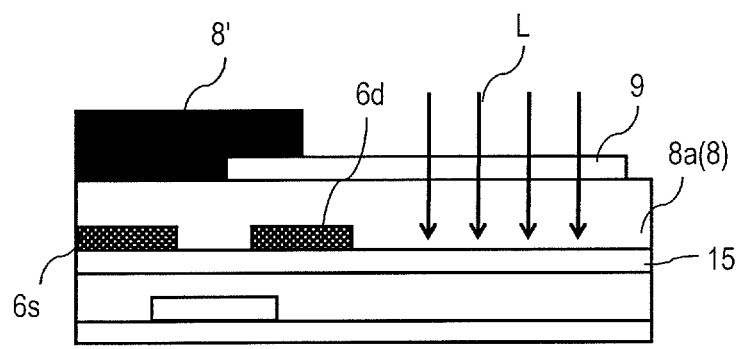

*FIG.14*
(a)
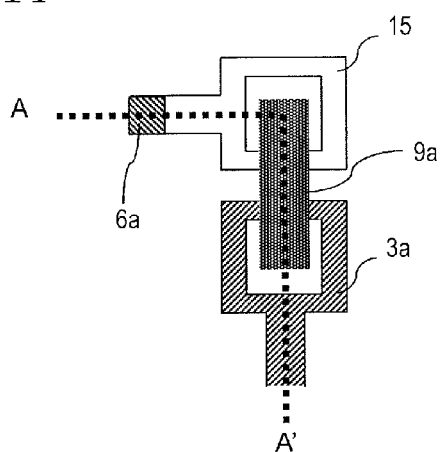
(b)
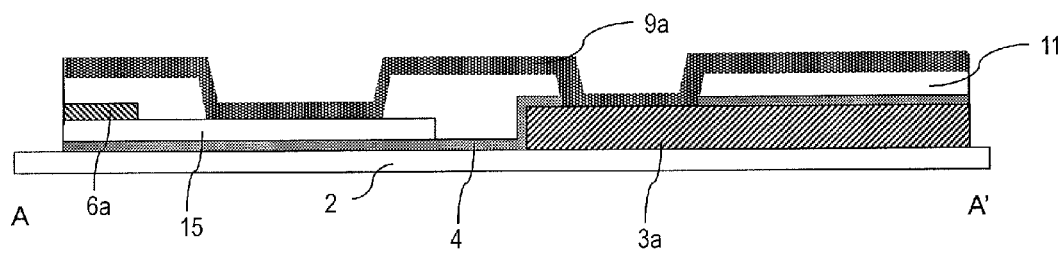
*FIG.15*
(a)
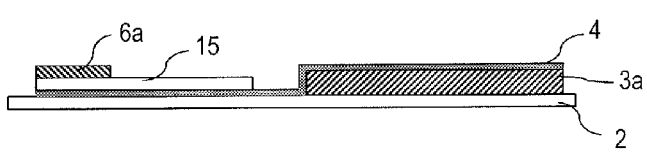
(b)
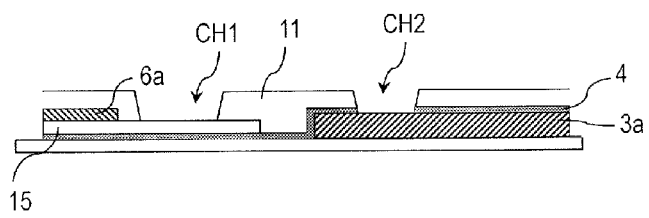

SEMICONDUCTOR DEVICE AND METHOD OF MANUFACTURE THEREOF

TECHNICAL FIELD

The present invention relates to a semiconductor device which has been formed using an oxide semiconductor and a method for fabricating such a device, and more particularly relates to an active-matrix substrate for use in a liquid crystal display device or an organic EL display device and a method for fabricating such a substrate. In this description, the "semiconductor devices" include an active-matrix substrate and a display device which uses the active-matrix substrate.

BACKGROUND ART

An active-matrix substrate for use in a liquid crystal display device and other devices includes switching elements such as thin-film transistors (which will be simply referred to herein as "TFTs"), each of which is provided for an associated one of pixels. An active-matrix substrate including TFTs as switching elements is called a "TFT substrate".

As for TFTs, a TFT which uses an amorphous silicon film as its active layer (and will be referred to herein as an "amorphous silicon TFT") and a TFT which uses a polysilicon film as its active layer (and will be referred to herein as a "polysilicon TFT") have been used extensively.

Recently, people have proposed that an oxide semiconductor be used as a material for the active layer of a TFT instead of amorphous silicon or polysilicon. Such a TFT will be referred to herein as an "oxide semiconductor TFT". Since an oxide semiconductor has higher mobility than amorphous silicon, the oxide semiconductor TFT can operate at higher speeds than an amorphous silicon TFT. Also, such an oxide semiconductor film can be formed by a simpler process than a polysilicon film.

Patent Document No. 1 discloses a method for fabricating a TFT substrate including oxide semiconductor TFTs. According to the method disclosed in Patent Document No. 1, a TFT substrate can be fabricated in a reduced number of manufacturing process steps by forming a pixel electrode with the resistance of the oxide semiconductor film locally lowered.

Recently, as the definition of liquid crystal display devices and other devices has become higher and higher, a decrease in pixel aperture ratio has become an increasingly serious problem. In this description, the "pixel aperture ratio" refers herein to the ratio of the combined area of pixels (e.g., the combined area of regions which transmit light that contributes to a display operation in a transmissive liquid crystal display device) to the overall display area. In the following description, the "pixel aperture ratio" will be simply referred to herein as an "aperture ratio".

Among other things, a medium to small sized transmissive liquid crystal display device to be used in a mobile electronic device has so small a display area that each of its pixels naturally has a very small area and the aperture ratio will decrease particularly significantly when the definition is increased. On top of that, if the aperture ratio of a liquid crystal display device to be used in a mobile electronic device decreases, the luminance of the backlight needs to be increased to achieve an intended brightness, thus causing an increase in power dissipation, too, which is also a problem.

To achieve a high aperture ratio, the combined area occupied by a TFT, a storage capacitor, and other elements of a non-transparent material in each pixel may be decreased. However, naturally, the TFT and the storage capacitor should have their minimum required size to perform their function. When oxide semiconductor TFTs are used as TFTs, the TFTs can have a smaller size than when amorphous silicon TFTs are used, which is advantageous. It should be noted that in order to maintain a voltage that has been applied to the liquid crystal layer of a pixel (which is called a "liquid crystal capacitor" electrically), the "storage capacitor" is provided electrically in parallel with the liquid crystal capacitor. In general, at least a portion of the storage capacitor is arranged so as to overlap with the pixel.

CITATION LIST

Patent Literature

Patent Document No. 1: Japanese Laid-Open Patent Publication No. 2011-91279

SUMMARY OF INVENTION

Technical Problem

However, demands for increased aperture ratios are too huge to satisfy just by using oxide semiconductor TFTs. Meanwhile, as the prices of display devices have become lower and lower year after year, development of a technology for manufacturing high-definition, high-aperture-ratio display devices at a lower cost is awaited.

Also, the present inventors discovered and confirmed via experiments that when the method disclosed in Patent Document No. 1 was adopted, the reliability might decrease due to a low degree of contact between the oxide semiconductor film and a metal layer such as the source line. Among other things, the reliability might decrease in a portion of the source line that has been formed in a peripheral area that does not contribute to a display operation, for example. This respect will be described in detail later.

Thus, a primary object of the present invention is to provide a TFT substrate which can be fabricated by a simpler process and which can contribute to realizing a display device with higher definition and a higher aperture ratio than conventional ones and with a good degree of reliability and also provide a method for fabricating such a semiconductor device.

Solution to Problem

A semiconductor device according to an embodiment of the present invention includes: a substrate; a gate electrode formed on the substrate; a gate insulating layer formed on the gate electrode; an oxide layer which is formed on the gate insulating layer and which includes a semiconductor region and a conductor region that contacts with the semiconductor region, wherein the semiconductor region overlaps at least partially with the gate electrode with the gate insulating layer interposed between them; a source electrode and a drain electrode which are electrically connected to the semiconductor region; an insulating layer formed on the source and drain electrodes; a transparent electrode arranged to overlap at least partially with the conductor region with the insulating layer interposed between them; a source line formed out of the same conductive film as the source electrode; and a gate extended line formed out of the same conductive film as the gate electrode. The source line is electrically connected to the gate line via a transparent connecting layer which is formed out of the same conductive film as the transparent electrode.

In one embodiment, the semiconductor device further includes a protective layer which contacts with a channel region of the semiconductor region. The protective layer is formed on the source line and the insulating layer is formed on the protective layer.

In one embodiment, the transparent connecting layer contacts with the oxide layer, and the source line is electrically connected to the transparent connecting layer via the oxide layer.

In one embodiment, the gate extended line includes a gate connecting terminal layer. The semiconductor device includes another transparent connecting layer which is formed out of the same conductive film as the transparent electrode. And that another transparent connecting layer contacts with the upper surface of the gate connecting terminal layer.

In one embodiment, the oxide layer includes In, Ga and Zn.

A method for fabricating a semiconductor device according to an embodiment of the present invention includes the steps of: (a) providing a substrate; (b) forming a gate electrode, a gate extended line, and a gate insulating layer on the substrate; (c) forming an oxide semiconductor film on the gate insulating layer; (d) forming a conductive film on the oxide semiconductor film and patterning the oxide semiconductor film and the conductive film through a single photomask, thereby forming an oxide semiconductor layer, a source electrode, a drain electrode and a source line; (e) forming a protective layer which protects a channel region of the oxide semiconductor layer and then performing a resistance lowering process to lower the resistance of a portion of the oxide semiconductor layer, thereby forming a conductor region and turning another portion of the oxide semiconductor layer that has not had its resistance lowered into a semiconductor region; (f) forming an insulating layer on the source and drain electrodes; and (g) forming a transparent electrode and a transparent connecting layer on the insulating layer. The transparent electrode overlaps at least partially with the conductor region via the insulating layer interposed between them, and the source line is electrically connected to the gate extended line via the transparent connecting layer.

In one embodiment, the step (e) is performed between the steps (d) and (f).

In one embodiment, the step (e) is performed between the steps (f) and (g).

In one embodiment, the step (e) includes forming the conductor region by implanting a dopant into a portion of the oxide semiconductor layer through the insulating layer.

In one embodiment, the step (e) is performed after the step (g) has been performed.

In one embodiment, the step (e) includes forming the conductor region by implanting a dopant into a portion of the oxide semiconductor layer through the insulating layer and the transparent electrode.

In one embodiment, the protective layer is formed on the source line and the insulating layer is formed on the protective layer.

In one embodiment, the step (g) includes forming another transparent connecting layer, the gate extended line includes a gate connecting terminal layer, and that another transparent connecting layer contacts with the upper surface of the gate connecting terminal layer.

Advantageous Effects of Invention

Embodiments of the present invention provide a TFT substrate which can be fabricated by a simpler process and which can contribute to realizing a display device with higher definition and a higher aperture ratio than conventional ones and with a good degree of reliability and also provide a method for fabricating such a semiconductor device.

BRIEF DESCRIPTION OF DRAWINGS

FIG. 3 (a) is a schematic enlarged plan view of the portion X shown in FIG. 1. (b) is a schematic cross-sectional view of the TFT substrate 100A as viewed on the plane A-A' shown in FIG. 3(a). (c) is a schematic cross-sectional view of the TFT substrate 100A as viewed on the plane B-B' shown in FIG. 1.

FIG. 4 A schematic cross-sectional view of a liquid crystal display device 500 including a TFT substrate 100A according to an embodiment of the present invention.

FIG. 5(a) to (e) are schematic cross-sectional views illustrating respective manufacturing process steps to fabricate the TFT substrate 100A.

FIG. 10 A schematic cross-sectional view illustrating an exemplary method for fabricating the TFT substrate 100B.

FIG. 11(a) to (c) are schematic cross-sectional views illustrating an exemplary series of manufacturing process steps to fabricate the TFT substrate 100B.

FIG. 12(a) to (c) are schematic cross-sectional views illustrating another exemplary series of manufacturing process steps to fabricate the TFT substrate 100B.

FIG. 13(a) to (c) are schematic cross-sectional views illustrating still another exemplary series of manufacturing process steps to fabricate the TFT substrate 100B.

FIG. 14(a) is a schematic enlarged plan view of the portion X shown in FIG. 1. (b) is a schematic cross-sectional view of a TFT substrate 100C as viewed on the plane A-A' shown in FIG. 14(a).

FIG. 15 (a) and (b) are schematic cross-sectional views illustrating an exemplary series of manufacturing process steps to fabricate the TFT substrate 100C.

DESCRIPTION OF EMBODIMENTS

Hereinafter, a semiconductor device as an embodiment of the present invention will be described with reference to the accompanying drawings. The semiconductor device of this embodiment includes a thin-film transistor with an active layer made of an oxide semiconductor (which will be referred to herein as an "oxide semiconductor TFT"). It should be noted that the semiconductor device of this embodiment just needs to include an oxide semiconductor TFT and is broadly applicable to an active-matrix substrate and various kinds of display devices and electronic devices.

In the following description, a semiconductor device as an embodiment of the present invention will be described as being applied to a TFT substrate with an oxide semiconductor TFT for use in a liquid crystal display device.

Figure 1:
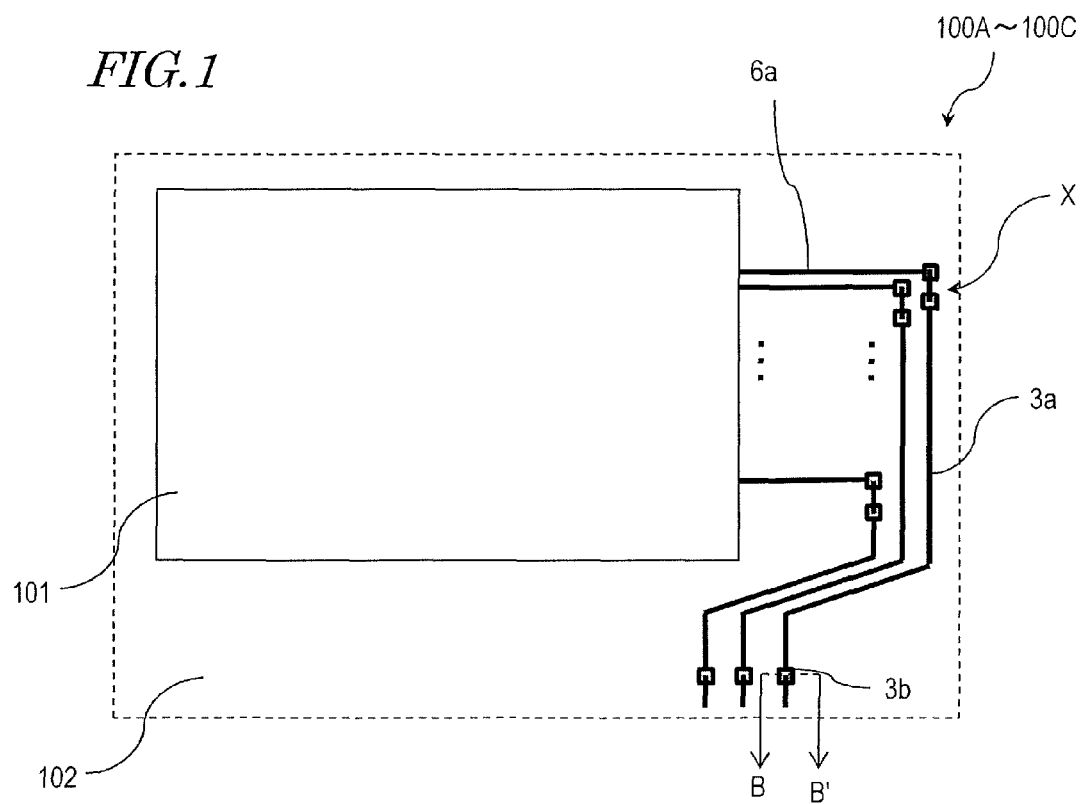
FIG. 1 A schematic plan view of a semiconductor device (TFT substrate) 100A to 100C according to an embodiment of the present invention.

FIG. 1 is a schematic plan view of a TFT substrate 100A according to this embodiment. FIG. 2(a) is a schematic plan view of a single pixel of the TFT substrate 100A. FIG. 2(b) is a schematic cross-sectional view thereof as viewed on the plane A1-A1' shown in FIG. 2(a). FIG. 3(a) is a schematic enlarged plan view of the portion X shown in FIG. 1. FIG. 3(b) is a schematic cross-sectional view thereof as viewed on the plane A-A' shown in FIG. 3(a). FIG. 3(c) is a schematic cross-sectional view thereof as viewed on the plane B-B' shown in FIG. 1. And FIG. 4 is a schematic cross-sectional view illustrating a liquid crystal display device 500 as an embodiment of the present invention.

As shown in FIG. 1, the TFT substrate 100A has a display area 101 and a peripheral area 102 which surrounds the display area 101. In the display area 101, an oxide semiconductor TFT is provided for each of a plurality of pixels. In the peripheral area 102, arranged are portions of source lines 6a and gate extended lines 3a.

First of all, the display area 101 will be described.

Figure 2:
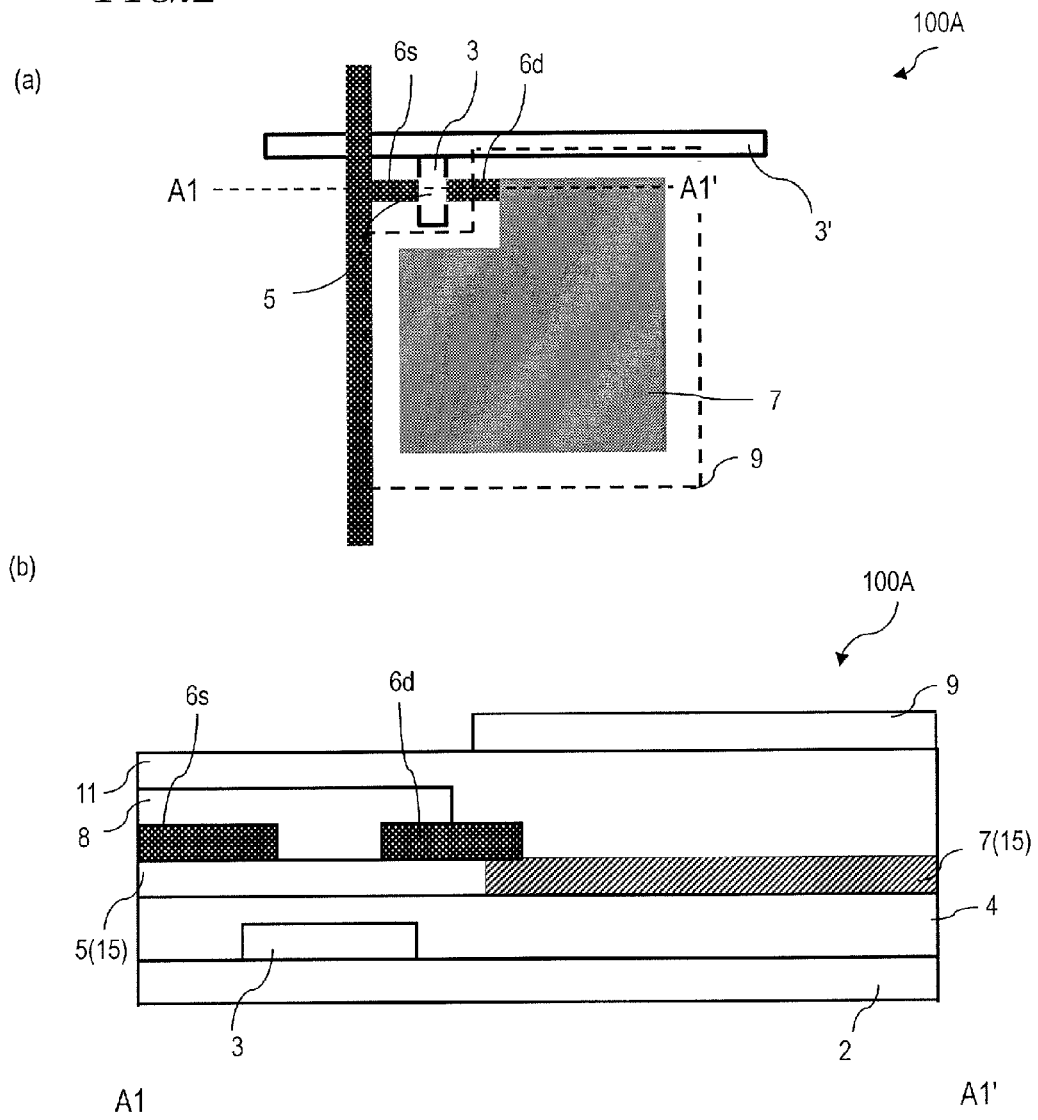
FIG. 2 (a) is a schematic plan view of a single pixel of the TFT substrate 100A. (b) is a schematic cross-sectional view of the TFT substrate 100A as viewed on the plane A1-A1' shown in (a).

As shown in FIGS. 2(a) and 2(b), the TFT substrate 100A includes a substrate 2, a gate electrode 3 formed on the substrate 2, a gate insulating layer 4 formed on the gate electrode 3, and an oxide layer (which will be sometimes referred to herein as an "oxide semiconductor layer") 15 which is formed on the gate insulating layer 4 and which includes a semiconductor region 5 and a conductor region 7 which contacts with the semiconductor region 5. The semiconductor region 5 overlaps at least partially with the gate electrode 3 with the gate insulating layer 4 interposed between them. The TFT substrate 100A further includes source and drain electrodes 6s, 6d which are electrically connected to the semiconductor region 5, an insulating layer (passivation layer) 11 formed on the source and drain electrodes 6s, 6d, and a transparent electrode 9 arranged so as to overlap at least partially with the conductor region 7 with an insulating layer 11 interposed between them. In the example illustrated in FIG. 2, the conductor region 7 may also function as a transparent electrode (such as a pixel electrode).

The conductor region 7 of the oxide layer 15 has a lower electrical resistance than the semiconductor region 5. The electrical resistance of the conductor region 7 may be 100 kΩ/□ or less, for example, and is suitably 10 kΩ/□ or less. The conductor region 7 may be formed by locally lowering the resistance of an oxide semiconductor film, for example. Although it depends on what processing method is taken to lower the resistance, the conductor region 7, for example, may be doped more heavily with a dopant (such as boron) than the semiconductor region 5 is.

In this TFT substrate 100A, by locally lowering the resistance of the oxide layer 15, a conductor region 7 to be a pixel electrode may be defined and the rest of the oxide layer 15 which remains the same semiconductor can turn into a semiconductor region 5 to be the active layer of a TFT. Thus, the manufacturing process can be simplified.

In addition, according to this embodiment, at least a part of the transparent electrode 9 overlaps with the conductor region 7 with the insulating layer 11 interposed between them. As a result, a storage capacitor is formed in the region where these two transparent electrodes overlap with each other. However, this storage capacitor is transparent (i.e., can transmit visible light), and does not decrease the aperture ratio. Consequently, this TFT substrate 100A can have a higher aperture ratio than a conventional TFT substrate with a storage capacitor including a non-transparent electrode. On top of that, since the aperture ratio is not decreased by the storage capacitor, the capacitance value of the storage capacitor (i.e., the area of the storage capacitor) can be increased as needed, which is also advantageous. Optionally, the transparent electrode 9 may be formed so as to cover almost the entire pixel (but the area where the TFT is present).

Furthermore, as will be described in detail later, according to this embodiment, the oxide layer 15, source and drain electrodes 6s, 6d and source line 6a are formed by performing a half-tone exposure process using a single photomask (i.e., a half-tone mask). As a result, the number of photomasks to use can be reduced and eventually the manufacturing cost can be cut down.

As shown in FIG. 2(b), a protective layer 8 which contacts with the channel region of the semiconductor region 5 may be provided on the oxide layer 15.

A source electrode 6s and a drain electrode 6d is formed on the oxide layer 15. The drain electrode 6d suitably contacts with at least a portion of the upper surface of the conductor region 7. The reason will be described below.

As mentioned above, Patent Document No. 1 teaches forming a pixel electrode by lowering the resistance of an oxide semiconductor film locally. However, the present inventors discovered and confirmed via experiments that the method disclosed in Patent Document No. 1 had the following problem.

Specifically, according to the method proposed in Patent Document No. 1, when viewed along a normal to the TFT substrate, there is a gap between the pixel electrode and drain electrode, and the pixel electrode cannot be formed to reach the end portion of the drain electrode, which is a problem. In contrast, according to this embodiment, when viewed along a normal to the substrate 2, the conductor region 7 is arranged so that its end portion on the channel side overlaps with the drain electrode 6d. Consequently, there is no gap between a portion of the conductor region 7 functioning as a pixel electrode and the drain electrode 6d, and the aperture ratio can be further increased.

Next, the peripheral area 102 will be described.

As shown in FIGS. 3(a) and 3(b), the TFT substrate 100A includes a source line 6a which contacts with the oxide layer 15 and which is formed out of the same conductive film as the source electrode 6s, and a gate extended line 3a which is formed out of the same conductive film as the gate electrode 3. The source line 6a is electrically connected to the gate extended line 3a via a transparent connecting layer 9a which is formed out of the same conductive film as the transparent electrode 9.

As shown in FIG. 3(b), a protective layer 8 is formed on the source line 6a, and an insulating layer 11 is formed on the protective layer 8. As will be described later, the protective layer 8 is sometimes omitted.

Furthermore, as shown in FIG. 3(c), the gate extended line 3a suitably includes a gate connecting terminal layer 3b, the TFT substrate 100A suitably further includes another transparent connecting layer 9b which is formed out of the same conductive film as the transparent electrode 9, and that another transparent connecting layer 9b suitably contacts with the upper surface of the gate connecting terminal layer 3b.

According to Patent Document No. 1, an oxide layer and a source line layer are patterned by the half-tone exposure technique in order to reduce the number of masks to use in the manufacturing process. If this technique is adopted, however, the source line layer including the source and drain electrodes and the source line and the oxide layer cannot be patterned independently of each other. That is why a data signal line (i.e., source bus line, or source line) to be formed in the display area of a display device, a portion of signal lines, an extended line, a terminal connecting portion and other members arranged around the display area will have a multilayer structure consisting of an oxide layer and source line layer. In that case, although it depends on the material of the source electrode, due to the heat applied during the manufacturing process (i.e., the heat that is intentionally applied to the substrate to perform an annealing process or a film deposition process), the closeness of contact between the oxide layer and the source line layer will decrease so much as to cause peeling easily at their interface. To avoid such a problem, the process temperature could be lowered. In that case, however, it would be difficult to achieve the intended TFT characteristic with certainty and the reliability could decrease. Such a problem arises particularly frequently in a portion of a source line arranged in the peripheral area.

As described above, if the source line 6a and the oxide layer 15 were formed by the method disclosed in Patent Document No. 1, then the oxide layer 15 would be formed to contact with the lower surface of the source line 6a. That is why the larger the area of the source line 6a, the larger the area of contact between the source line 6a and the oxide layer 15 and the more likely peeling would occur in the interface between the source line 6a and the oxide layer 15 for the reason described above. According to this embodiment, the source line 6a is not extended as it is to the vicinity of a terminal portion to be electrically connected to an external circuit (e.g., to the vicinity of the gate connecting terminal layer 3b shown in FIG. 1), but once changed into a gate extended line 3a, which is extended to the vicinity of the terminal portion. In this manner, the area of contact between the source line 6a and the oxide layer 15 can be reduced and it is possible to prevent the source line 6a from peeling off the oxide layer 15.

The substrate 2 is typically a transparent substrate and may be a glass substrate, for example, but may also be a plastic substrate. Examples of the plastic substrates include a substrate made of either a thermosetting resin or a thermoplastic resin and a composite substrate made of these resins and an inorganic fiber (such as glass fiber or a non-woven fabric of glass fiber). A resin material with thermal resistance may be polyethylene terephthalate (PET), polyethylene naphthalate (PEN), polyether sulfone (PES), an acrylic resin, or a polyimide resin, for example. Also, when used in a reflective liquid crystal display device, the substrate 2 may also be a silicon substrate.

The gate electrode 3 is electrically connected to a gate line 3'. The gate electrode 3 and the gate line 3' may have a multilayer structure, of which the upper layer is a W (tungsten) layer and the lower layer is a TaN (tantalum nitride) layer, for example. Alternatively, the gate electrode 3 and the gate line 3' may also have a multilayer structure consisting of Mo (molybdenum), Al (aluminum) and Mo layers or may even have a single-layer structure, a double layer structure, or a multilayer structure consisting of four or more layers. Still alternatively, the gate electrode 3 may be made of an element selected from the group consisting of Cu (copper), Al, Cr (chromium), Ta (tantalum), Ti (titanium), Mo and W or an alloy or metal nitride which is comprised mostly of any of these elements. The thickness of the gate electrode 3 suitably falls within the range of about 50 nm to about 600 nm, for example. In this embodiment, the gate electrode 3 may have a thickness of approximately 420 nm, for example.

The gate insulating layer 4 may also be a single layer or a multilayer structure of $SiO_2$ (silicon dioxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), or tantalum oxide ($Ta_2O_3$). The thickness of the gate insulating layer 4 suitably falls within the range of about 50 nm to about 600 nm. Optionally, the gate insulating layer 4 may be comprised of a lower gate insulating layer made of $SiN_x$ or $SiN_xO_y$ (silicon nitride oxide, where x>y) to prevent dopants from diffusing from the substrate 1, and an upper gate insulating layer made of either $SiO_2$ or $SiO_xN_y$ (silicon oxynitride, where x>y) to prevent the semiconductor properties of the semiconductor region 5 from deteriorating. Furthermore, to form a dense gate insulating layer 4 which causes little gate leakage current at low temperatures, the gate insulating layer 4 is suitably formed using a rare gas of Ar (argon), for example. The gate insulating layer 4 may have a thickness of about 375 nm.

The oxide layer 15 may be formed out of an In—Ga—Zn—O based film including In (indium), Ga (gallium) and Zn (zinc) at a ratio of 1:1:1. The ratio of In, Ga and Zn may be selected appropriately.

The oxide layer 15 does not have to be formed out of an In—Ga—Zn—O based film, but may also be formed out of any other suitable oxide film such as a Zn—O based (ZnO) film, an In—Zn—O based (IZO™) film, a Zn—Ti—O based (ZTO) film, a Cd—Ge—O based film, a Cd—Pb—O based film, a CdO (cadmium oxide) film, or an Mg—Zn—O based film. Furthermore, the oxide layer 15 may also be made of ZnO in an amorphous state, a polycrystalline state, or a microcrystalline state (which is a mixture of amorphous and polycrystalline states) to which one or multiple dopant elements selected from the group consisting of Group I, Group XIII, Group XIV, Group XV and Group XVII elements have been added, or may even be ZnO to which no dopant elements have been added at all. An amorphous oxide film is suitably used as the oxide layer 15, because the semiconductor device can be fabricated at a low temperature and can achieve high mobility in that case. The thickness of the oxide layer 15 may fall within the range of about 30 nm to about 100 nm, for example (e.g., approximately 50 nm).

The oxide layer 15 of this embodiment includes a semiconductor region 5 and a conductor region 7 which has a lower electrical resistance than the semiconductor region 5 does. Such an oxide layer 15 may be formed by lowering the resistance of a portion of the oxide semiconductor film. Although it depends on what method is used to lower the resistance, the low-resistance portion may be doped more heavily with a p-type dopant (such as B (boron)) or an n-type dopant (such as P (phosphorus)) than the high-resistance portion is. The low-resistance portion may have an electrical resistance of 100 k Ω/☐ or less, and suitably has an electrical resistance of 10 kΩ/☐ or less.

The source line layer (including the source and drain electrodes 6s and 6d and source lines 6a in this case) may have a multilayer structure comprised of Ti, Al and Ti layers, for example. Alternatively, the source line layer may also have a multilayer structure comprised of Mo, Al and Mo layers or may even have a single-layer structure, a double layer structure or a multilayer structure consisting of four or more layers. Furthermore, the source line layer may also be made of an element selected from the group consisting of Al, Cr, Ta, Ti, Mo and W, or an alloy or metal nitride comprised mostly of any of these elements. The thickness of the source line layer may fall within the range of about 50 nm to about 600 nm (e.g., approximately 350 nm), for example.

The protective layer 8 is suitably made of an insulating oxide (such as $SiO_2$). If the protective layer 8 is made of an insulating oxide, it is possible to prevent the oxygen deficiencies in the semiconductor region 5 of the oxide layer 15 from deteriorating the semiconductor properties. Alternatively, the protective layer 8 may also be made of SiON (which may be either silicon oxynitride or silicon nitride oxide), $Al_2O_3$ or $Ta_2O_5$, for example. The thickness of the protective layer 8 suitably falls within the range of about 50 nm to about 300 nm, for example. In this embodiment, the protective layer 8 may have a thickness of about 150 nm, for example.

The insulating layer 11 may be made of $SiN_x$, for example. Alternatively, the insulating layer 11 may also be made of $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$). The thickness of the insulating layer 11 may fall within the range of about 100 nm to about 500 nm (e.g., approximately 200 nm). Optionally, the insulating layer 11 may have a multilayer structure.

The transparent electrode 9 and transparent connecting layers 9a, 9b are formed out of a transparent conductive film such as an ITO film or an IZO film. The thickness of the transparent electrode 9 and transparent connecting layers 9a, 9b may each fall within the range of 20 nm to 200 nm. The transparent electrode 9 and transparent connecting layers 9a, 9b may each have a thickness of about 100 nm. It should be noted that in this embodiment, the transparent connecting layer 9a does not contact with the transparent connecting layer 9b.

As shown in FIG. 4, this TFT substrate 100A may be used in a fringe field switching (FFS) mode liquid crystal display device 500, for example. In this case, the conductor region 7 that forms the lower layer is used as a pixel electrode to which a display signal voltage is applied, and the transparent electrode 9 that forms the upper layer is used as a common electrode (to which either a common voltage or a counter voltage is applied). At least one slit is cut through the transparent electrode 9. An FFS mode liquid crystal display device 500 with such a configuration is disclosed in Japanese Laid-Open Patent Publication No. 2011-53443, for example, the entire disclosure of which is hereby incorporated by reference.

This liquid crystal display device 500 includes the TFT substrate 100A, a counter substrate 200, and a liquid crystal layer 50 interposed between the TFT substrate 100A and the counter substrate 200. In this liquid crystal display device 500, no counter electrode such as a transparent electrode of ITO, for example, is arranged on the surface of the counter substrate 200 to face the liquid crystal layer 50. Instead, a display operation is carried out by controlling the alignments of liquid crystal molecules in the liquid crystal layer 50 with a lateral electric field which is generated by the conductor region (pixel electrode) 7 and transparent electrode (common electrode) 9 that are formed on the TFT substrate 100A.

Hereinafter, an exemplary method for fabricating this TFT substrate 100A will be described.

A method for fabricating the TFT substrate 100A according to an embodiment of the present invention includes the steps of (a) providing a substrate 2 and (b) forming a gate electrode 3 and a gate extended line 3a out of the same conductive film and a gate insulating layer 4 on the substrate 2. The method further includes the steps of: (c) forming an oxide semiconductor film on the gate insulating layer 4; and (d) forming a conductive film on the oxide semiconductor film and patterning the oxide semiconductor film and the conductive film through a single photomask, thereby forming an oxide semiconductor layer 15, a source electrode 6s, a drain electrode 6d and a source line 6a. The method further includes the steps of: (e) forming a protective layer 8 which protects a channel region of the oxide semiconductor layer 15 and then performing a resistance lowering process to lower the resistance of a portion of the oxide semiconductor layer 15, thereby forming a conductor region 7 and turning another portion of the oxide semiconductor layer 15 that has not had its resistance lowered into a semiconductor region 5; (f) forming an insulating layer 11 on the source and drain electrodes 6s, 6d; and (g) forming a transparent electrode 9 and a transparent connecting layer 9a on the insulating layer 11 out of the same transparent conductive film. The transparent electrode 9 overlaps at least partially with the conductor region 7 via the insulating layer 11 interposed between them, and the source line 6a is electrically connected to the gate extended line 3a via the transparent connecting layer 9a.

The step (e) may be performed between the steps (d) and (f).

The step (e) may be performed between the steps (f) and (g).

The step (e) may include forming the conductor region 7 by implanting a dopant into a portion of the oxide semiconductor layer 15 through the insulating layer 11.

The step (e) may be performed after the step (g) has been performed.

The step (e) may include forming the conductor region 7 by implanting a dopant into a portion of the oxide semiconductor layer 15 through the insulating layer 11 and the transparent electrode 9.

The protective layer 8 may be formed on the source line 6a and the insulating layer 11 may be formed on the protective layer 8.

The step (g) may include forming another transparent connecting layer 9b. The gate extended line 3a may include a gate connecting terminal layer 3b. And the transparent connecting layer 9b may contact with the upper surface of the gate connecting terminal layer 3b.

Figure 6:
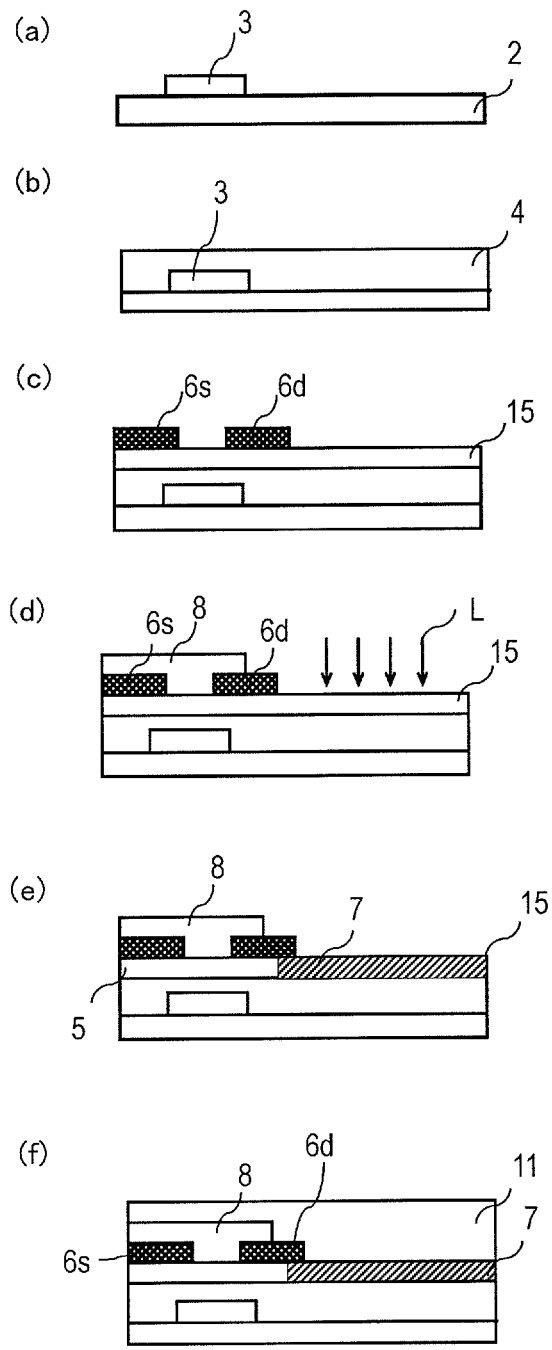
FIG. 6(a) to (f) are schematic cross-sectional views illustrating respective manufacturing process steps to fabricate the TFT substrate 100A.

Hereinafter, an exemplary method for fabricating this TFT substrate 100A will be described in detail with reference to FIGS. 5 and 6. FIGS. 5(a) to 5(e) are cross-sectional views illustrating respective manufacturing process steps to fabricate the TFT substrate 100A. FIGS. 6(a) to 6(f) are schematic cross-sectional views illustrating respective manufacturing process steps to fabricate the TFT substrate 100A. The method for fabricating the TFT substrate 100A illustrated in FIGS. 6(a) through 6(f) is disclosed in PCT/JP2013/051422, the entire disclosure of which is hereby incorporated by reference.

First of all, as shown in FIGS. 5(a) and 6(a), a gate electrode 3 and a gate extended line 3a are formed on a substrate 2.

Next, as shown in FIGS. 5(b) and 6(b), a gate insulating layer 4 is deposited on the gate electrode 3 and the gate extended line 3a by CVD (chemical vapor deposition) process. After that, an oxide semiconductor film is formed on the gate insulating layer 4.

As the substrate 2, a transparent insulating substrate such as a glass substrate, for example, may be used. The gate electrode 3 and gate extended line 3a may be formed by depositing a conductive film on the substrate 2 by sputtering process and then patterning the conductive film by photolithographic process using a first photomask (not shown). In this example, a multilayer film with a double layer structure consisting of a TaN film (with a thickness of about 50 nm) and a W film (with a thickness of about 370 nm) that have been stacked one upon the other in this order on the substrate 2 is used as the conductive film. As this conductive film, a single-layer film of Ti, Mo, Ta, W, Cu, Al or Cr, a multilayer film or alloy film including any of these elements in combination, or a metal nitride film thereof may also be used.

The gate insulating layer 4 may be made of $SiO_2$, $SiN_x$, $SiO_xN_y$ (silicon oxynitride, where x>y), $SiN_xO_y$ (silicon nitride oxide, where x>y), $Al_2O_3$, or $Ta_2O_5$. In this embodiment, the gate insulating layer 4 may have a thickness of about 375 nm, for example.

The oxide semiconductor film may be deposited on the gate insulating layer 4 by sputtering process, for example. In this embodiment, an In—Ga—Zn—O based semiconductor film is used as the oxide semiconductor film, which may have a thickness of about 50 nm, for example.

Subsequently, a conductive film (not shown) is deposited on the oxide semiconductor film by sputtering process, for example. In this example, a conductive film with a multilayer structure consisting of Ti, Al and Ti layers was used as the conductive film. The lower Ti layer may have a thickness of about 50 nm, the Al layer may have as thickness of about 200 nm, and the upper Ti layer may have a thickness of about 100 nm.

Thereafter, as shown in FIGS. 5(c) and 6(c), by performing a half-tone exposure process using a second photomask (half-tone mask, not shown), a resist film with varying thicknesses is formed on the conductive film. After that, an oxide semiconductor layer 15 is formed out of the oxide semiconductor film and a source electrode 6s, a drain electrode 6d and a source line 6s are formed out of the conductive film by dry etching or ashing processes, for example. Since the oxide semiconductor layer 15, source and drain electrodes 6s, 6d and source line 6a can be formed using a single photomask, the manufacturing cost can be cut down.

Subsequently, as shown in FIGS. 5(d) and 6(d), a protective layer 8 is formed on the source and drain electrodes 6s, 6d and source line 6s using a third photomask (not shown). The protective layer 8 is formed to contact with, and protect, the channel region of the oxide semiconductor layer 15. The protective layer 8 is also formed on the source line 6a and on the gate insulating layer 4 on the gate extended line 3a. The protective layer 8 has a hole 8u which overlaps with the source line 6a when viewed along a normal to the substrate 2 and through which the source line 6a is partially exposed. Also, the gate insulating layer 4 on the gate extended line 3a and the protective layer 8 are etched simultaneously, thereby creating a hole 8v which overlaps with the gate extended line 3a when viewed along a normal to the substrate 2 through the gate insulating layer 4 and the protective layer 8 and exposing the gate extended line 3a partially.

The protective layer 8 may be made of $SiO_2$, for example, and may have a thickness of about 150 nm, for example.

Next, as shown in FIG. 6(d), the oxide semiconductor layer 15 is subjected to a resistance lowering process. In this embodiment, by irradiating the substrate 2 with plasma L coming from over the substrate 2, a portion of the oxide semiconductor layer 15 which is not covered with the protective layer 8, the source or drain electrode 6s, 6d or the source line 6a has its resistance lowered.

As a result of this resistance lowering process, a portion of the oxide semiconductor layer 15 which is not covered with the protective layer 8, the source or drain electrode 6s, 6d or the source line 6a has had its resistance lowered to be a conductor region 7 as shown in FIG. 6(e). Meanwhile, the rest of the oxide semiconductor layer 15 that has not had its resistance lowered is left as a semiconductor region 5. The electrical resistance of that portion that has been subjected to the resistance lowering process is lower than that of the portion that has not been subjected to the resistance lowering process.

The resistance lowering process may be plasma processing or doping a p-type dopant or an n-type dopant, for example. If a region that needs to have its resistance lowered is doped with a p-type dopant or an n-type dopant, then the dopant concentration of the conductor region 7 becomes higher than that of the semiconductor region 5.

Due to diffusion of the dopant, sometimes a portion of the oxide semiconductor layer 15 which is located under the drain electrode 6d may also have its resistance lowered and eventually form part of the conductor region 7.

Examples of alternative resistance lowering processes include hydrogen plasma processing using a CVD system, argon plasma processing using an etching system, and an annealing process under a reducing ambient.

Next, as shown in FIGS. 5(e) and 6(f), an insulating layer (dielectric layer or passivation layer) 11 is formed on the protective layer 8 and conductor region 7 by CVD process, for example.

In this embodiment, the insulating layer 11 is formed out of $SiO_2$ (with a thickness of 200 nm, for example). Holes are cut through a predetermined region of the insulating layer 11 using a fourth photomask (not shown). As a result, a contact hole CH1 which exposes the source line 6a partially and a contact hole CH2 which exposes the gate extended line 3a partially are created.

Thereafter, as shown in FIGS. 2(b) and 3(b), a transparent conductive film is deposited to a thickness of 100 nm, for example, on the insulating layer 11 and then patterned using a fifth photomask, thereby forming a transparent electrode 9 and a transparent connecting layer 9a. As the transparent conductive film, an ITO (indium tin oxide) film, an IZO film or any other suitable film may be used. Although not shown, the transparent electrode 9 also fills the hole of the insulating layer 11 and is connected to a predetermined electrode. Furthermore, as shown in FIG. 3(b), the transparent connecting layer 9a contacts with the source line 6a and gate extended line 3a inside the contact holes CH1 and CH2, respectively, thereby electrically connecting the source line 6a and the gate extended line 3a together. Although not shown, a transparent connecting layer 9b is also formed out of a transparent conductive film so as to contact with the upper surface of the gate terminal connecting layer 3b included in the gate extended line 3a. In this manner, a semiconductor device (TFT substrate) 100A is completed.

As can be seen from the foregoing description, according to this embodiment, the gate extended line 3a and the source line 6a can be electrically connected together via the transparent connecting layer 9a that is formed out of a transparent conductive film. That is to say, a gate line layer which is formed out of the same conductive film as the gate electrode 3a and a source line layer which is formed out of the same conductive film as the source electrode 6s can be electrically connected together via a transparent connecting layer which is formed out of a transparent conductive film. Consequently, a thin-film transistor array in which not only pixel switching TFTs but also a peripheral circuit and a pixel circuit to be used in a medium to small sized high definition liquid crystal display are integrated together can be fabricated easily. In addition, by reducing the source line 6a as much as possible and minimizing the area of contact between a source line layer (including the source line 6a) which is formed out of the same conductive film as the source electrode 6s and the oxide semiconductor layer 15, it is possible to prevent the source line 6a from peeling off the oxide semiconductor layer 15, for example.

Thereafter, a counter substrate 200 is provided and the counter substrate 200 and the TFT substrate 100A are fixed with a liquid crystal layer 50 interposed between them. In this manner, the liquid crystal display device 500 shown in FIG. 4 is completed.

Hereinafter, a TFT substrate 100B as another embodiment of the present invention will be described with reference to FIGS. 7 and 8, in which any component also included in the TFT substrate 100A and having substantially the same function as its counterpart is identified by the same reference numeral as its counterpart's and description thereof will be omitted herein to avoid redundancies. As a schematic plan view of the TFT substrate 100B, FIGS. 1 and 2(a) will be referred to. And as a schematic enlarged plan view of the portion X shown in FIG. 1, FIG. 3(a) will be referred to.

Figure 7:
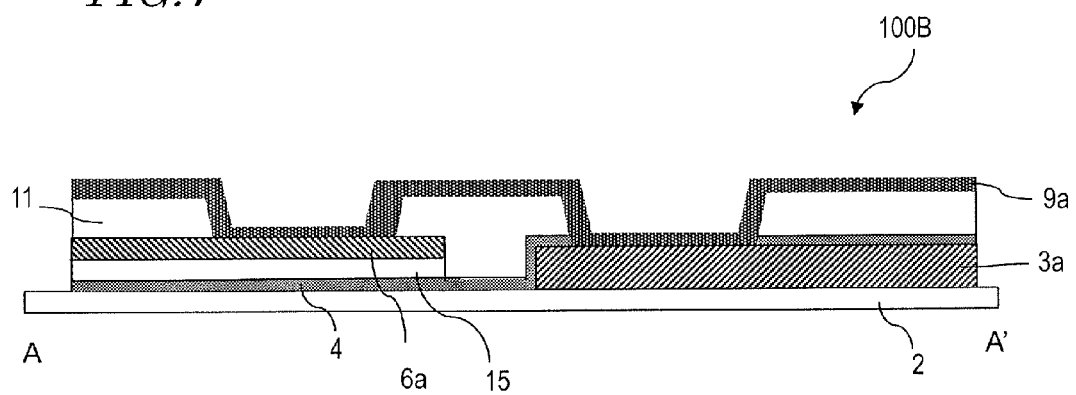
FIG. 7 A schematic cross-sectional view of a TFT substrate 100B as viewed on the plane A-A' shown in FIG. 3(a).
Figure 8:
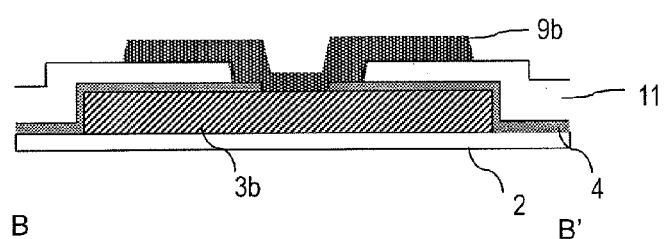
FIG. 8 A schematic cross-sectional view of the TFT substrate 100B as viewed on the plane B-B' shown in FIG. 1.
Figure 9:
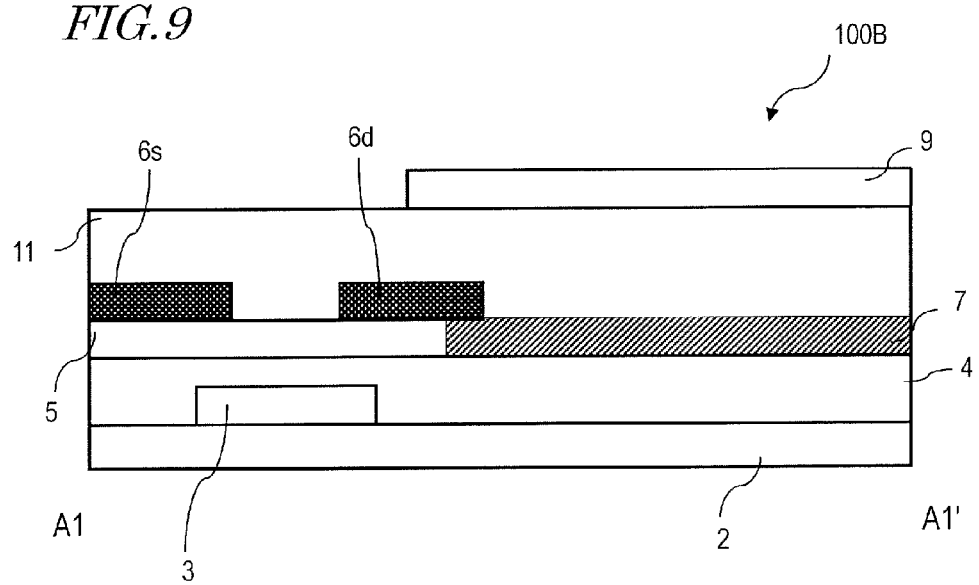
FIG. 9 A schematic plan view of the TFT substrate 100B as viewed on the plane A1-A1' shown in FIG. 2(a).

FIG. 7 is a schematic cross-sectional view as viewed on the plane A-A' shown in FIG. 3(a). FIG. 8 is a schematic cross-sectional view as viewed on the plane B-B' shown in FIG. 1. And FIG. 9 is a schematic cross-sectional view as viewed on the plane A1-A1' shown in FIG. 2(a).

This TFT substrate 100B includes no protective layer 8, which is a difference from the TFT substrate 100A.

As in the TFT substrate 100A described above, a storage capacitor is also formed in this TFT substrate 100B by the conductor region 7, the transparent electrode 9 and an insulating layer between them, and therefore, a high aperture ratio can be achieved. In addition, since the protective layer 8 can be omitted, the manufacturing cost can be cut down. Furthermore, since the depth of the contact holes CH1 and CH2 can be decreased by the thickness of the protective layer 8 omitted, the transparent connecting layer 9a that fills the contact holes CH1 and CH2 can be prevented from being disconnected.

As well as the TFT substrate 100A, the TFT substrate 100B of this embodiment is also applicable to an FFS mode liquid crystal display device (see FIG. 4).

Hereinafter, an exemplary method for fabricating the TFT substrate 100B will be described with reference to FIGS. 10 and 11. FIG. 10 is a cross-sectional view illustrating a manufacturing process step to fabricate the TFT substrate 100B and corresponds to FIG. 7. FIGS. 11(a) to 11(c) are schematic cross-sectional views illustrating manufacturing process steps to fabricate the TFT substrate 100B and correspond to FIG. 9.

First, as shown in FIGS. 5(a) to 5(c) and FIGS. 6(a) to 6(c), a gate electrode 3 and a gate extended line 3a are formed on a substrate 2. A gate insulating layer 4 is formed on the gate electrode 3 and the gate extended line 3a. An oxide semiconductor layer 15 is formed on the gate insulating layer 4. And then a source electrode 6s, a drain electrode 6d and a source line 6a are formed on the oxide semiconductor layer 15.

Next, as shown in FIG. 11(a), a resist layer 8' is formed as a protective layer by photolithographic process using a third photomask (not shown) so as to contact with the channel region of the oxide semiconductor layer 15. The resist layer 8' is made of a photosensitive resin. And the channel region of the oxide semiconductor layer 11 is protected with the resist layer 8'.

Next, the oxide semiconductor layer 15 is subjected to a resistance lowering process from over the substrate 2. In this embodiment, by irradiating the oxide semiconductor layer 15 with plasma L, a portion of the oxide semiconductor layer 15 which is not covered with the resist layer 8', the source or drain electrode 6s, 6d or the source line 6a has its resistance lowered.

As a result of this resistance lowering process, a portion of the oxide semiconductor layer 15 which is not covered with the resist layer 8', the source or drain electrode 6s, 6d or the source line 6a has had its resistance lowered to be a conductor region 7 as shown in FIG. 11(b). Meanwhile, the rest of the oxide semiconductor layer 15 that has not had its resistance lowered is left as a semiconductor region 5. The electrical resistance of that portion that has been subjected to the resistance lowering process is lower than that of the portion that has not been subjected to the resistance lowering process.

The resistance lowering process may be plasma processing or doping a p-type dopant or an n-type dopant, for example. If a region that needs to have its resistance lowered is doped with a p-type dopant or an n-type dopant, then the dopant concentration of the conductor region 7 becomes higher than that of the semiconductor region 5.

Due to diffusion of the dopant, sometimes a portion of the oxide semiconductor layer 15 which is located under the drain electrode 6d may also have its resistance lowered and eventually form part of the conductor region 7.

Examples of alternative resistance lowering processes include hydrogen plasma processing using a CVD system, argon plasma processing using an etching system, and an annealing process under a reducing ambient.

After that, the resist layer 8' is stripped by a known method.

Next, as shown in FIGS. 10 and 11(c), an insulating layer (dielectric layer or passivation layer) 11 is formed on the source and drain electrodes 6s, 6d, source line 6a and conductor region 7 by CVD process, for example.

In this embodiment, the insulating layer 11 is formed out of $SiO_2$ (with a thickness of 200 nm, for example). Holes are cut through a predetermined region of the insulating layer 11 using a fourth photomask (not shown). As a result, a contact hole CH1 which exposes the source line 6a partially and a contact hole CH2 which exposes the gate extended line 3a partially are created.

Thereafter, as shown in FIGS. 7 and 9, a transparent conductive film is deposited to a thickness of 100 nm, for example, on the insulating layer 11 and then patterned using a fifth photomask, thereby forming a transparent electrode 9 and a transparent connecting layer 9a. As the transparent conductive film, an ITO film, an IZO film or any other suitable film may be used. Although not shown, the transparent electrode 9 also fills the hole of the insulating layer 11 and is connected to a predetermined electrode. Furthermore, as shown in FIG. 7(b), the transparent connecting layer 9a contacts with the source line 6a and gate extended line 3a inside the contact holes CH1 and CH2, respectively, thereby electrically connecting the source line 6a and the gate extended line 3a together. In this manner, a semiconductor device (TFT substrate) 100B is completed.

In the manufacturing process of the TFT substrate 100B described above, the process steps of making TFTs and their associated members as shown in FIGS. 11(a) to 11(c) may also be performed in the following manner.

FIGS. 12 and 13 are schematic cross-sectional views illustrating an alternative series of manufacturing process steps to fabricate TFTs and their associated members in the TFT substrate 100B.

First, as shown in FIGS. 5(a) to 5(c) and FIGS. 6(a) to 6(c), a gate electrode 3 and a gate extended line 3a are formed on a substrate 2. A gate insulating layer 4 is formed on the gate electrode 3 and the gate extended line 3a. An oxide semiconductor layer 15 is formed on the gate insulating layer 4. And then a source electrode 6s, a drain electrode 6d and a source line 6a are formed on the oxide semiconductor layer 15.

Next, as shown in FIG. 12(a), an insulating layer 11 is formed on the source and drain electrodes 6s, 6d by CVD process, for example. In this process step, the insulating layer 11 is also formed on the source line 6a, and the contact holes CH1 and CH2 are created using a third photomask (not shown, see FIG. 10).

Subsequently, as shown in FIG. 12(b), a resist layer 8' is formed as a protective layer on the insulating layer 11 by photolithographic process using a fourth photomask (not shown) so as to overlap with the channel region of the oxide semiconductor layer 15 when viewed along a normal to the substrate 2. The resist layer 8' does not contact with the channel region of the oxide semiconductor layer 11.

Next, the oxide semiconductor layer 15 is subjected to a resistance lowering process from over the substrate 2 and through the insulating layer 11. In this embodiment, by irradiating the oxide semiconductor layer 15 with plasma L, a portion of the oxide semiconductor layer 15 which is not covered with the resist layer 8' has its resistance lowered.

As a result of this resistance lowering process, a portion of the oxide semiconductor layer 15 which is not covered with the resist layer 8' has had its resistance lowered to be a conductor region 7 as shown in FIG. 12(c). Meanwhile, the rest of the oxide semiconductor layer 15 that has not had its resistance lowered is left as a semiconductor region 5. The electrical resistance of that portion that has been subjected to the resistance lowering process is lower than that of the portion that has not been subjected to the resistance lowering process.

The resistance lowering process may be plasma processing or doping a p-type dopant or an n-type dopant, for example. If a region that needs to have its resistance lowered is doped with a p-type dopant or an n-type dopant, then the dopant concentration of the conductor region 7 becomes higher than that of the semiconductor region 5.

Due to diffusion of the dopant, sometimes a portion of the oxide semiconductor layer 15 which is located under the drain electrode 6d may also have its resistance lowered and eventually form part of the conductor region 7.

Examples of alternative resistance lowering processes include hydrogen plasma processing using a CVD system, argon plasma processing using an etching system, and an annealing process under a reducing ambient.

After that, the resist layer 8' is stripped by a known method.

Next, as shown in FIGS. 7 and 9, a transparent conductive film is deposited on the insulating layer 11 and then patterned using a fifth photomask, thereby forming a transparent electrode 9 and a transparent connecting layer 9a.

As shown in FIG. 7, the transparent connecting layer 9a contacts with the source line 6a and gate extended line 3a inside the contact holes CH1 and CH2, respectively, thereby electrically connecting the source line 6a and the gate extended line 3a together. In this manner, a semiconductor device (TFT substrate) 100B is completed.

Hereinafter, still another exemplary method of making TFTs and their associated members in the TFT substrate 100B will be described with reference to FIG. 13.

First, as shown in FIGS. 5(a) to 5(c) and FIGS. 6(a) to 6(c), a gate electrode 3 and a gate extended line 3a are formed on a substrate 2. A gate insulating layer 4 is formed on the gate electrode 3 and the gate extended line 3a. An oxide semiconductor layer 15 is formed on the gate insulating layer 4. And then a source electrode 6s, a drain electrode 6d and a source line 6a are formed on the oxide semiconductor layer 15.

Next, as shown in FIG. 13(a), an insulating layer 11 is formed on the source and drain electrodes 6s, 6d by CVD process, for example. In this process step, the insulating layer 11 is also formed on the source line 6a, and the contact holes CH1 and CH2 described above are created using a third photomask (not shown, see FIG. 10).

Next, as shown in FIGS. 13(b) and 9, a transparent conductive film is deposited on the insulating layer 11 and then patterned using a fourth photomask (not shown), thereby forming a transparent electrode 9 and a transparent connecting layer 9a. As shown in FIG. 9, the transparent connecting layer 9a contacts with the source line 6a and gate extended line 3a inside the contact holes CH1 and CH2, respectively, thereby electrically connecting the source line 6a and the gate extended line 3a together.

Subsequently, as shown in FIG. 13(c), a resist layer 8' is formed as a protective layer on the insulating layer 11 by photolithographic process using a fifth photomask so as to overlap with the channel region of the oxide semiconductor layer 15 when viewed along a normal to the substrate 2. The resist layer 8' does not contact with the channel region of the oxide semiconductor layer 11.

Next, the oxide semiconductor layer 15 is subjected to a resistance lowering process from over the substrate 2 and through the insulating layer 11 and the transparent electrode 9. In this embodiment, by irradiating the oxide semiconductor layer 15 with plasma L, a portion of the oxide semiconductor layer 15 which is not covered with the resist layer 8', source electrode 6s, drain electrode 6d or source line 6a has its resistance lowered.

As a result of this resistance lowering process, a portion of the oxide semiconductor layer 15 which is not covered with the resist layer 8', source electrode 6s, drain electrode 6d or source line 6a has had its resistance lowered to be a conductor region 7. Meanwhile, the rest of the oxide semiconductor layer 15 that has not had its resistance lowered is left as a semiconductor region 5. The electrical resistance of that portion that has been subjected to the resistance lowering process is lower than that of the portion that has not been subjected to the resistance lowering process.

The resistance lowering process may be plasma processing or doping a p-type dopant or an n-type dopant, for example. If a region that needs to have its resistance lowered is doped with a p-type dopant or an n-type dopant, then the dopant concentration of the conductor region 7 becomes higher than that of the semiconductor region 5.

Due to diffusion of the dopant, sometimes a portion of the oxide semiconductor layer 15 which is located under the drain electrode 6d may also have its resistance lowered and eventually form part of the conductor region 7.

Examples of alternative resistance lowering processes include hydrogen plasma processing using a CVD system, argon plasma processing using an etching system, and an annealing process under a reducing ambient.

After that, the resist layer 8' is stripped by a known method. In this manner, the TFT substrate 100B shown in FIGS. 7 and 9 is completed.

Hereinafter, a TFT substrate 100C as still another embodiment of the present invention will be described with reference to FIG. 14, in which any component also included in the TFT substrate 100A and having substantially the same function as its counterpart is identified by the same reference numeral as its counterpart's and description thereof will be omitted herein to avoid redundancies. As a schematic plan view of the TFT substrate 100C, FIG. 1 will be referred to. Furthermore, since the structure in the vicinity of the gate connecting terminal layer 3b is the same as that of the TFT substrate 100B, its description will be omitted (see FIG. 8).

FIG. 14(a) is a schematic enlarged plan view of the portion X shown in FIG. 1. FIG. 14(b) is a schematic cross-sectional view as viewed on the plane A-A' shown in FIG. 14(a).

In this TFT substrate 100C, the transparent connecting layer 9a contacts with the oxide layer 15 and the source line 6a is electrically connected to the transparent connecting layer 9a via the oxide layer 15, which are major differences from the TFT substrate 100B. For example, if the source line 6a contacts with the transparent connecting layer 9a, the contact resistance could increase in some cases due to the presence of a Schottky barrier between the transparent connecting layer 9a and the source line 6a. However, the transparent connecting layer 9a and oxide layer 15 are both made of an oxide. That is why even if the transparent connecting layer 9a contacts with the oxide layer 15, an increase in contact resistance due to the presence of a Schottky barrier between the transparent connecting layer 9a and the oxide layer 15 can be checked. As a result, a good contact resistance can be obtained.

As in the TFT substrate 100A described above, a storage capacitor is also formed in this TFT substrate 100C by the conductor region 7, the transparent electrode 9 and an insulating layer between them, and therefore, a high aperture ratio can be achieved.

As well as the TFT substrate 100A, the TFT substrate 100C of this embodiment is also applicable to an FFS mode liquid crystal display device (see FIG. 4).

Hereinafter, an exemplary method for fabricating this TFT substrate 100C will be described with reference to FIG. 15. Since the TFTs and their associated members of the TFT substrate 100C are the same as those of the TFT substrate 100B, description thereof will be omitted herein.

First of all, as shown in FIGS. 5(a) and 5(b), a gate extended line 3a is formed on the substrate 2 by the method described above. After that, a gate insulating layer 4 is formed on the gate extended line 3a by the method described above.

Next, as shown in FIG. 15(a), an oxide semiconductor layer 15 and a source line 6a are formed by the method described above. In this process step, the source line 6a is formed so that the side surface of the source line 6a is located on the oxide semiconductor layer 15 and that the oxide semiconductor layer 15 is partially exposed.

Subsequently, as shown in FIG. 11(a), a resist layer 8' is formed by the method described above so as to contact with the channel region of the oxide semiconductor layer 15 and a portion of the oxide semiconductor layer 15 which is not covered with the resist layer 8', source electrode 6s, drain electrode 6d or source line 6a has its resistance lowered by the method described above. In addition, the exposed portion of the oxide semiconductor layer 15 shown in FIG. 15(a) (including a portion to contact with the transparent connecting layer 9a to be described later) has its resistance lowered, too.

Then, as shown in FIG. 15(b), an insulating layer 11 is formed on the source line 6a and the gate insulating layer 4 by the method described above. In this process step, a contact hole CH1 which exposes the oxide semiconductor layer 15 partially and a contact hole CH2 which exposes the gate extended line 3a partially are created.

Thereafter, as shown in FIG. 14(b), a transparent connecting layer 9a is formed on the insulating layer 11 by the method described above. As shown in FIG. 14(b), the transparent connecting layer 9a contacts with the oxide semiconductor layer 15 and the gate extended line 3a inside the contact holes CH1 and CH2, respectively, thereby electrically connecting the source line 6a and the gate extended line 3a together. In this manner, the semiconductor device (TFT substrate) 100C is completed.

As can be seen from the foregoing description, embodiments of the present invention provide a TFT substrate which can be fabricated by a simpler process and which can contribute to realizing a display device with higher definition and a higher aperture ratio than conventional ones and also provide a method for fabricating such a TFT substrate.

INDUSTRIAL APPLICABILITY

The present invention is applicable broadly to various types of devices that use a thin-film transistor. Examples of such devices include circuit boards such as an active-matrix substrate, display devices such as a liquid crystal display, an organic electroluminescence (EL) display, and an inorganic electroluminescence display, image capture devices such as an image sensor, and electronic devices such as an image input device and a fingerprint scanner.

REFERENCE SIGNS LIST 2 substrate
3 gate electrode
3a gate extended line
3b gate connecting terminal layer
5 semiconductor region
6s source electrode
6d drain electrode
6a source line
7 conductor region
9 transparent electrode
11 insulating layer
15 oxide layer
100A to 100C semiconductor device (TFT substrate)
101 display area
102 peripheral area.

The invention claimed is:

1. A semiconductor device comprising:
a substrate;
a gate electrode formed on the substrate;
a gate insulating layer formed on the gate electrode;
an oxide layer which is formed on the gate insulating layer and which includes a semiconductor region and a conductor region that contacts with the semiconductor region, wherein the semiconductor region overlaps at least partially with the gate electrode with the gate insulating layer interposed between them;
a source electrode and a drain electrode which are electrically connected to the semiconductor region;
an insulating layer formed on the source and drain electrodes;
a transparent electrode arranged to overlap at least partially with the conductor region with the insulating layer interposed between them;
a source line formed out of the same conductive film as the source electrode; and
a gate extended line formed out of the same conductive film as the gate electrode,
wherein the source line is electrically connected to the gate extended line via a transparent connecting layer which is formed out of the same conductive film as the transparent electrode.

2. The semiconductor device of claim 1, further comprising a protective layer which contacts with a channel region of the semiconductor region,
wherein the protective layer is formed on the source line and the insulating layer is formed on the protective layer.

3. The semiconductor device of claim 1, wherein the transparent connecting layer contacts with the oxide layer, and the source line is electrically connected to the transparent connecting layer via the oxide layer.

4. The semiconductor device of claim 1, wherein the gate extended line includes a gate connecting terminal layer,
the semiconductor device includes another transparent connecting layer which is formed out of the same conductive film as the transparent electrode, and
that another transparent connecting layer contacts with the upper surface of the gate connecting terminal layer.

5. The semiconductor device of claim 1, wherein the oxide layer includes In, Ga and Zn.

* * * * *